US006187248B1

(12) United States Patent
O'Neill et al.

(10) Patent No.: US 6,187,248 B1
(45) Date of Patent: Feb. 13, 2001

(54) NANOPOROUS POLYMER FILMS FOR EXTREME LOW AND INTERLAYER DIELECTRICS

(75) Inventors: Mark Leonard O'Neill, Allentown; Lloyd Mahlon Robeson, Macungie; William Franklin Burgoyne, Jr.; Michael Langsam, both of Allentown, all of PA (US)

(73) Assignee: Air Products and Chemicals, Inc., Allentown, PA (US)

( * ) Notice: Under 35 U.S.C. 154(b), the term of this patent shall be extended for 0 days.

(21) Appl. No.: 09/196,452

(22) Filed: Nov. 19, 1998

(51) Int. Cl.[7] .................... B29C 35/08; B29C 41/04; B29C 67/20
(52) U.S. Cl. .............. 264/425; 264/41; 264/83; 264/216; 264/272.17; 264/310
(58) Field of Search ................ 264/41, 83, 216, 264/272.17, 310, 425

(56) References Cited

U.S. PATENT DOCUMENTS

| 4,717,393 | 1/1988 | Hayes . |
| 5,658,994 | 8/1997 | Burgoyne, Jr. et al. . |

OTHER PUBLICATIONS

L. Mascia, The Role of Additives in Plastics, 1974.
Kiefer et al. (Macromolecules, 29 (1996) 8546).
Hedrick et al. (Polymer, 34 (1993) 4717).
Charlier et al. (Polymer, 36, No. 5 (1995) 987).
Hedrick et al. (Chem. Mater., 10 (1998) 39).
Kesting and Fritzsche (Polymeric Gas Separation Membranes, 1993).
Saunders et al. (ASME, 53 (1994) 243).
Young, et al., Desalination 103 (1995) pp. 233–247.
Lin, et al. Macromolecules, 1988, 21, pp. 1165–1169.
Lin et al, Macromol., 21 (1988) 165).

*Primary Examiner*—Leo B. Tentoni
(74) *Attorney, Agent, or Firm*—Geoffrey L. Chase

(57) ABSTRACT

A process for producing a nanoporous polymer film of no greater than 10 micron thickness having low dielectric constant value, including the steps of: (a) providing a polymer in a solution with at least two solvents for the polymer in which a lowest boiling solvent and a highest boiling solvent have a difference in their respective boiling points of approximately 50° C. or greater; (b) forming a film of the polymer in solution with at least the two solvents on a substrate; (c) removing a predominant amount of the lowest boiling solvent; (d) contacting the film with a fluid which is a non-solvent for the polymer, but which is miscible with the at least two solvents to induce phase inversion in the film; (e) forming an average pore size in the film in the range of less than 30 nanometers.

The present invention is also nanoporous films made by the above process.

16 Claims, No Drawings

NANOPOROUS POLYMER FILMS FOR EXTREME LOW AND INTERLAYER DIELECTRICS

BACKGROUND OF THE INVENTION

The electronics industry utilizes dielectric materials as insulating layers between circuits and components of integrated circuits and associated electronic devices. Line dimensions are being reduced in order to increase speed and storage capability of microelectronic devices (e.g., computer chips). Microchip dimensions have undergone a significant decrease even in the past decade such that line widths previously >1 micron are being decreased to 0.25 microns, with future plans on the drawing boards of as low as 0.07 microns. As the line dimensions decrease, the requirements for preventing signal crossover (crosstalk) between the chip components become much more severe. These requirements can be summarized by the expression RC, where R=resistance of the conductive line and C=capacitance of the dielectric layer. Decreasing the dielectric constant will decrease the capacitance of the interlayer which will aid in minimizing RC.

Historically, silica with a dielectric constant of 4.2–4.5 has been employed as the interlayer dielectric (ILD). However at line dimensions of 0.25 microns and less silica is no longer acceptable, and is expected to be replaced by polymers as the ILD material of choice. Representative polymers which meet the demanding requirements for an ILD material include the poly(arylene ethers) with dielectric values in the range of 2.6–2.8, such as that described in U. S. Pat. No. 5,658,994. Ultimately materials with dielectric constant values of 2.0 or less will be required as the line dimensions continue to decrease. The only polymers (nonporous) which reach values near or below 2.0 are fluorocarbon polymers. Fluorocarbon polymers have other drawbacks such as poor adhesion, potential reaction with metals at high temperature, poor rigidity at high temperature, and in some cases lower thermal stability than acceptable. In order to achieve the desired property characteristics and low dielectric constant values, nanoporous polymeric materials may be used.

Incorporation of porosity to polymeric materials is long known to reduce the dielectric constant of polymers (L. Mascia, The Role of Additives in Plastics, 1974). Microporous polymers (e.g., cyanate ester resins) have been noted by Kiefer et al. (Macromolecules, 29 (1996) 8546) to exhibit reduced dielectric constant values versus dense precursors. The resultant pore diameters were in the range of 10–20 microns which is orders of magnitude too large for line widths <0.25 microns. If polymeric materials are going be used as the interlayer in applications which require dielectric constant $\epsilon$<2.0 along with excellent stability, excellent adhesion, compatibility with the integration process (e.g., reactive ion etching, fabrication of thin films), ability to have global planarization, low water sorption, non-reactivity to metals, and constant dielectric constant up to and exceeding 1 GHz, then nanoporous films will be one of the alternatives to be considered.

The design of nanoporous polymers for these applications was reported by Hedrick and coworkers at IBM in several papers. Their procedure involved the synthesis of diblock copolymers comprised of a high $T_g$, thermally stable block and a lower $T_g$, thermally labile block. The resultant material phase separates into well-defined micellar domains. Upon exposure to temperatures above the decomposition temperature of the thermally labile block, but below the $T_g$ and thermal decomposition temperature of the high $T_g$ block, thermolysis of the former would occur to produce a nanoporous structure. Hedrick et al. (Polymer, 34 (1993) 4717) also noted the ability to generate porous polymers with nanometer sized pores using the above described technique employing poly(phenylquinoxaline) as the high $T_g$ stable block and poly(propylene oxide) or poly(methyl methacrylate) as the labile block. Charlier et al. (Polymer, 36, No. 5 (1995) 987) used this procedure employing poly(propylene oxide) as the labile block to produce nanoporous polyimides. Hedrick et al. (Chem. Mater., 10 (1998) 39) described polyimide nanofoams using aliphatic polyester based thermally labile blocks (e.g., poly($\epsilon$-caprolactone)) in polyimide block copolymers. Pore sizes of 6–7 nm were reported. While this procedure yields a nanoporous material, the dielectric constants reported are primarily above 2.0 and there appears to be a practical limit to the amount of porosity that can be achieved via this approach. The choice of polymeric materials with $T_g$ above 400 ° C., desired to be even >450° C., are very limited and generally involve very polar materials and/or materials with higher water sorption than desired.

One method for producing porous polymeric materials is termed phase inversion, commonly employed in the production of microporous membranes. The phase inversion process to produce porous membranes has been well described in the literature, including the book by Kesting and Fritzsche (Polymeric Gas Separation Membranes, 1993). The phase inversion process can involve a non-solvent induced phase separation or a temperature induced phase separation to produce pores in the micron to nanometer range. Saunders et al. (ASME, 53 (1994) 243) noted that spin coating on silicon wafers followed by non-solvent induced phase separation yielded microporous polyimide films with a reduced dielectric constant. A polyimide (Ultem 1000™) was spin coated onto a silicon wafer from a solution of 1,3-dimethoxybenzene followed by immersion in toluene, a non-solvent for the polymer. A specific example indicates film thickness of 22 microns with porosity of 68% and a pore size of 1.4 microns. The dielectric constant decreased from 3.15 for the dense film to 1.88 for the porous film. While this reference denotes a porous film with a reduced dielectric constant produced via non-solvent induced phase separation, the pore sizes being almost two orders of magnitude too large are considerably outside the realm of interest for present or future low dielectric constant interlayer materials. Therefore the methodology employed by this reference requires major changes in order to be able to achieve the desired film properties for an interlayer dielectric in microelectronic applications (e.g., computer chips). Young, et al., Desalination 103 (1995) pp 233–247 studied solvent based phase inversion for porous polymers and used combinations of solvents and nonsolvents to evaluate pore formation.

The prior art suffers from several disadvantages for using phase inversion for low dielectric films for microelectronics. One of the basic problems of the phase separation and spin coating process is that low viscosity (e.g., low solids content) solutions are required to yield thin films (~1$\mu$) with uniform wafer coverage. However the phase separation process using low viscosity, low solids solutions yields large pore structures; utilizing high solids solutions (>20 vol %) leads to exorbitantly thick films and inconsistent film thicknesses along the substrate. Also, the ability to tune porosity to a desired level with essentially constant film thickness is not possible with the current procedure due to the low viscosity requirements for the spin-on solution and the required non-volatile nature of the solvent, e.g., to prevent phase separation during casting. Another characteristic inherent with the prior art process when employing a low solids solution (as required for spin casting) is that the phase separation process leads to loss of adhesion to the desired substrate, often resulting in films detaching from the substrate during the non-solvent phase separation process. Poor adhesion is not acceptable and poor mechanical properties may lead to failure of the resulting interlayer during integration processing. A final problem which must be addressed for nanoporous ILDs arises from the temperature exposure inherent with typical microelectronic device manufacturing, e.g., up to 450° C. For a polymeric porous ILD with a $T_g$ below processing conditions, collapse of the porous structure will occur as the polymer relaxes to the equilibrium state of the material (i.e., dense film). It is known to crosslink polymers with photo crosslinkable groups (U.S. Pat. No. 4,717,393) and to do so for polyimide films for integrated circuits, Lin, et al. Macromolecules, 1988, 21, pp 1165–1169. This presents a well-defined hurdle which must be overcome to allow porous polymeric materials to be employed as ILDs. The present invention addresses all of these difficult requirements outlined above and demonstrates via experimental results that these issues can be resolved using the techniques and materials of the present invention set forth below.

BRIEF SUMMARY OF THE INVENTION

The present invention is a process for producing a nanoporous polymer film of no greater than 10 micron thickness having low dielectric constant value, comprising the steps of:

(a) providing a polymer in a solution with at least two solvents for the polymer in which a lowest boiling solvent and a highest boiling solvent have a variation or difference in their respective boiling points of approximately 50° C. or greater;

(b) forming a film of the polymer in solution with at least the two solvents on a substrate;

(c) removing a predominant amount of the lowest boiling solvent;

(d) contacting the film with a fluid which is a non-solvent for the polymer, but which is miscible with the at least two solvents to induce phase inversion in the film;

(e) forming an average pore size in the film in the range of less than 30 nanometers.

Preferably, the nanoporous film has a thickness of no greater than 2 microns.

Preferably, the substrate is a semiconductor.

Preferably, the lowest boiling solvent has a boiling point of approximately 100° C. or less and the highest boiling solvent has a boiling point of approximately 150° C. or more.

Preferably, the polymer is selected from the group consisting of poly(arylene ethers), polyimides, poly(phenyl quinoxalines), substituted poly(p-phenylenes), poly(benzobisoxazoles), polybenzimidazoles, polytriazoles and mixtures thereof.

Preferably, the lowest boiling solvent is selected from the group consisting of tetrahydrofuran, acetone, 1,4-dioxane, 1,3-dioxolane, ethyl acetate, methyl ethyl ketone, cyclohexanone, cyclopentanone and mixtures thereof.

Preferably, the highest boiling solvent is selected from the group consisting of dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, sulfolane, phenol, m-cresol, dimethyl sulfoxide, diphenyl ether, terphenyl, cyclohexanone, cyclopentanone and mixtures thereof.

Preferably, the fluid which is a non-solvent for the polymer is selected from the group consisting of water, methanol, ethanol, isopropanol, toluene, hexane, heptane, xylene, cyclohexane, butanol, cyclopentane, octane and miscible mixtures of these non-solvents.

Preferably, the polymer is crosslinked before contacting the film with the fluid which is a non-solvent.

Alternatively, the polymer is crosslinked after contacting the film with the fluid which is a non-solvent.

Preferably, the polymer is crosslinked by photochemical crosslinking.

Alternatively, the polymer is crosslinked by chemical crosslinking.

Preferably, the film is formed by spin casting.

Preferably, the contacting the film with the fluid which is a non-solvent is by spin casting, alternatively by immersion in non-solvent, further alternatively by non-solvent vapor atmosphere.

Alternatively, the contacting the film with the fluid which is a non-solvent is by immersion.

Further alternatively, the contacting the film with the fluid which is a non-solvent is by vapor atmosphere.

The present invention is also a low dielectric constant nanoporous film having average pore size of less than approximately 30 nanometers and no greater than 10 micron thickness made by the process of:

(a) providing a polymer in a solution with at least two solvents for the polymer in which a lowest boiling solvent and a highest boiling solvent have a variation or difference in their respective boiling points of approximately 50° C. or greater, (b) forming a film of the polymer in solution with the at least two solvents on a substrate;

(c) removing a predominant amount of the lowest boiling solvent;

(d) contacting the film with a fluid which is a non-solvent for the polymer, but which is miscible with the at least two solvents to induce phase inversion in the film;

(e) forming an average pore size in the film in the range of less than 30 nanometers.

The present invention is also a low dielectric constant nanoporous poly(arylene ether) film having average pore size of less than approximately 30 nanometers and a film thickness of less than 10 microns.

Preferably, the film has a film thickness of no greater than approximately 2 microns.

Preferably, the film has a porosity of approximately 10 to 60 volume percent.

More preferably, the film has a porosity of approximately 30 to 60 volume percent.

Preferably, the poly(arylene ether) comprises a poly(arylene ether) polymer consisting essentially of non-functional repeating units of the structure:

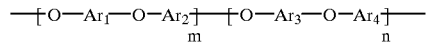

wherein m=0 to 1.0; and n=1.0−m; and $Ar_1$, $Ar_2$, $Ar_3$ and $Ar_4$ are individually divalent arylene radicals selected from the group consisting of;

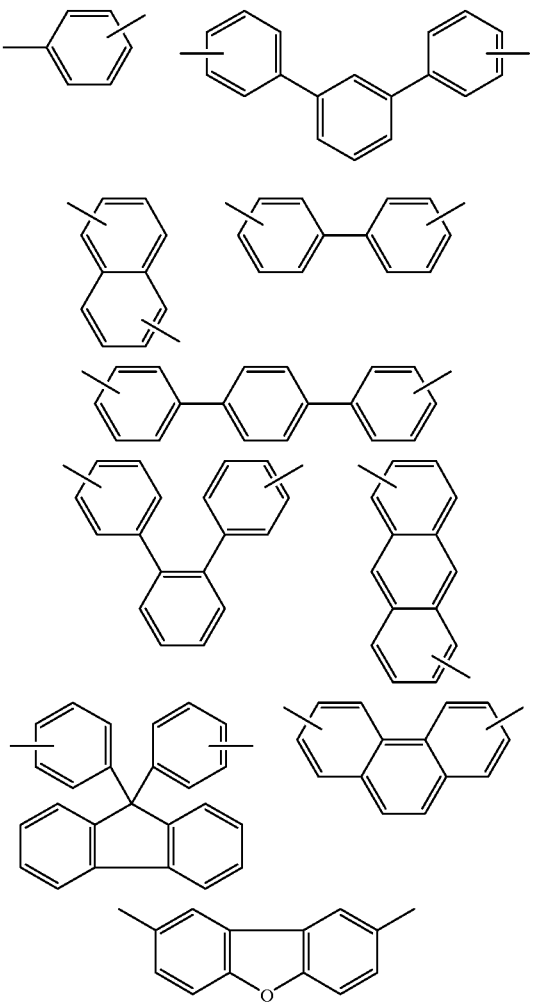

and mixtures thereof, but $Ar_1$, $Ar_2$, $Ar_3$ and $Ar_4$, other than the diradical 9,9-diphenylfluorene, are not isomeric equivalents.

Preferably, the film is supported on a semiconductor substrate of an integrated circuit.

Alternatively, the film is supported on a microelectronic material of an integrated circuit.

Preferably, the film has a film thickness of no greater than approximately 2 microns, a pore density of 30 to 60 volume percent and being crosslinked.

Preferably, the film has a $T_g$ of at least approximately 400° C.

BRIEF DESCRIPTION OF SEVERAL VIEWS OF THE DRAWINGS

Not Applicable

DETAILED DESCRIPTION OF THE INVENTION

In accordance with the present invention, the requirements for very low dielectric polymeric materials ($\epsilon$<2.0) can be addressed by the use of nanoporous materials. The few polymers which exhibit $\epsilon$<2.0 in the dense state have associated problems (thermal stability, adhesion, integration problems) that will preclude their utility in microelectronic applications.

The phase inversion process is a known method for producing microporous and nanoporous materials at the surface for hollow fibers employed for membrane applications. In order to achieve the desired porosity and viscosity required for thin film spin casting fabrication on semiconductors and electronic materials, it has been determined by the present invention that a single solvent system is not viable for the desired application. The molecular weights needed for mechanical properties require that a rather dilute solution, typically <20 wt % solids, be employed for achieving thin films on semiconductors or electronic materials such as silicon wafers via spin casting procedures. However, at these solids levels a phase inversion process typically yields a low density, highly porous and open cell foam with large pore dimensions.

The present invention demonstrates that, in order to achieve the low viscosities required to produce spin casting films of 1 micron thickness or less and yield solids levels such that the desired porosity and pore dimensions can be obtained, the polymer spin casting/phase inversion solvent must be comprised of multiple solvents with varying volatilities. Specifically a solution of the desired polymer involves at least a single lowest boiling solvent and a single highest boiling solvent, typically whose boiling points are different from one another by approximately 50° C. or greater, such that the lower boiling solvent will be able to evaporate rapidly leaving predominantly a higher solids solution comprised primarily of the highest boiling solvent and polymer prior to phase inversion. The exact boiling points are not critical, but could be generally <100° C. for the lowest boiling solvent and >150° C. for the highest boiling solvent. The key is to have a solvent mixture which will dissolve the polymer, with at least one of the solvents having a much higher volatilization rate relative to the other(s). The results after non-solvent induced phase inversion with the proper multiple solvent combination is an even porosity over the thickness of the film and an average pore size of <30 nm. Another requirement of the solvents is that they must be soluble (miscible) in the non-solvent chosen for the polymer phase inversion process.

Specific examples of polymers for this invention include poly(arylene ethers) as described in U.S. Pat. No. 5,658,994, incorporated herein in its entirety by reference. Preferably, the poly(arylene ether) comprises a poly(arylene ether) polymer consisting essentially of non-functional repeating units of the structure:

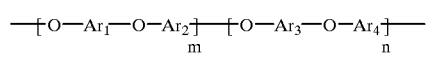

wherein m=0 to 1.0; and n=1.0−m; and $Ar_1$, $Ar_2$, $Ar_3$ and $Ar_4$ are individually divalent arylene radicals selected from the group consisting of;

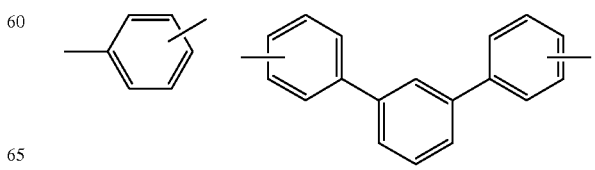

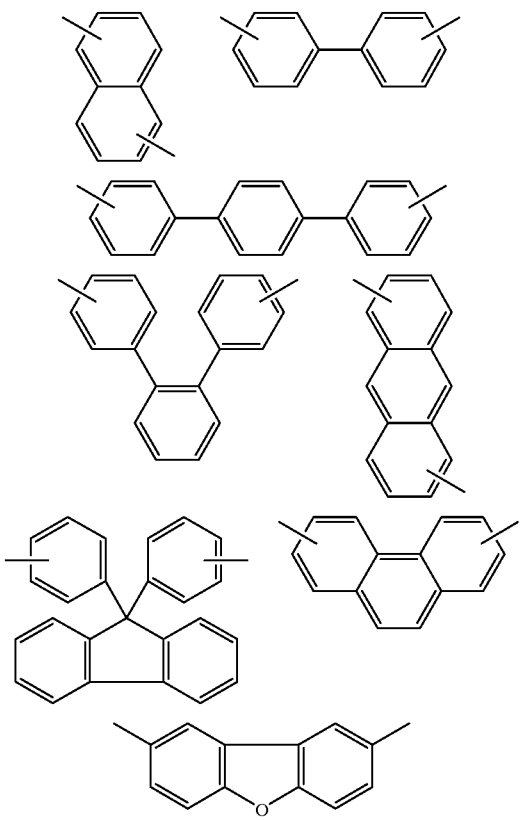

and mixtures thereof, but Ar$_1$, Ar$_2$, Ar$_3$ and Ar$_4$, other than the diradical 9,9-diphenylfluorene, are not isomeric equivalents. Preferred poly(arylene ethers) have the 9,9-diphenylfluorenyl group. Crosslinking groups are contemplated and are an exception to the nonfunctional criteria. Additional polymers which are acceptable are; polyimides, poly(phenyl quinoxalines), substituted poly(p-phenylenes), poly(benzobisoxazoles), polybenzimidazoles, polytriazoles and the like. The preferred polymers are chosen from the families of poly(arylene ethers) and polyimides.

The desired solvents are chosen from any solvents which exhibit solubility with the polymer either individually or when in combination. Two of the solvents must, with respect to one another, have sufficient boiling point differentials (by $\geq 50°$ C.) to achieve the solids content at the various sequences of the process as described herein. For the lowest boiling solvent, tetrahydrofuran, acetone, 1,4-dioxane, 1,3-dioxolane, ethyl acetate, methyl ethyl ketone are specific examples. For the highest boiling solvent dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, sulfolane, phenol, m-cresol, dimethyl sulfoxide, diphenyl ether, terphenyl and the like can be considered. Intermediate boiling solvents, such as cyclohexanone and cyclopentanone, could be used in either classification depending on the choice of the other solvent, but when chosen as the solvent for either the lowest boiling solvent or the highest boiling solvent, they could not also be chosen for utilization as the respective other solvent. Non-solvents can include water, methanol, ethanol, isopropanol, toluene, hexane, heptane, xylene, cyclohexane, butanol, cyclopentane, octane and any other liquid non-solvent, and miscible mixtures of these non-solvents. The choice of solvents and non-solvent does not preclude any systems that form associative complexes or azeotropes which may affect the volatility of the mixtures. The combination of solvents employed need not be individually solvents for the polymers as long as the combination employed provides a homogeneous solution with the polymer. In essence, non-solvents can be employed as long as the non-solvent/solvent combination as a mixture is a solvent for the polymer at the concentration and temperature applied in the spin casting process.

In the case where high $T_g$ polymers ($T_g > 400°$ C.) are employed in this process, crosslinking to lock-in the nanoporous structure may not be required. If crosslinking is required, the procedure can involve processing prior or post phase inversion, i.e., may be performed with solvent present or after the solvent material has been removed form the film. Crosslinking prior to phase inversion will allow for nanoporosity as the swollen crosslinked network cannot nucleate and diffuse into larger domains (and thus larger pores) with the addition of the non-solvent during the phase inversion process. Another procedure would be to crosslink (in the solid state) the phase inverted nanoporous polymer. In the former version, UV crosslinking or chemical crosslinking can be utilized. With UV crosslinking, UV sensitive crosslinkable groups on the polymer can yield crosslinked structures which, with proper crosslink density, will allow for stable nanoporous structures during exposure to elevated temperatures such as that which is experienced during integration steps of the microelectronic device fabrication. In the latter procedure, crosslinking is conducted on the phase inverted nanoporous structure where UV or other radiation procedures can be employed to lock-in the nanoporous structure. The solid polymer film would not be as amenable to chemical crosslinking as the solvent-swollen film would be. UV crosslinking of polyimides has been described in various reports (e.g., Lin et al, Macromol., 21 (1988) 165) and patents (e.g., U.S. Pat. No. 4,717,393).

One method of photocrosslinking the polymers of the present invention is to include the absorption of photochemical energy by a photosensitive group such as benzophenone chromophores, abstraction of the hydrogen atom from the benzylic function of the alkyl substituent on the diamine by an excited high energy state of the benzophenone function, followed by recombination of the resulting free radicals to form the crosslink. Photochemical mechanisms of this type are described in current photochemistry textbooks and are generally accepted by those practicing the art.

Other procedures such as reacting poly(arylene ethers) with carbonyl containing grafts can be employed to yield crosslinking upon UV exposure either with a higher boiling solvent present or in the solid nanoporous state. With UV exposure it is desired that the solvent system be a poorer absorber than the crosslinking moiety in the UV wavelength range required, and that it not quench or participate in the reaction unless specifically designed as such.

Chemical crosslinking is another method whereby nanoporous structures can be obtained which will not collapse after exposure to high (e.g., 400° C.) temperatures. An example of these structures could be polyimides whereby the dianhydrides or dianhydride terminated polyimide oligomers are crosslinked with diamines/triamines/polyamines to yield a highly crosslinked structure. The uncrosslinked reactants are spin cast on the wafer using the solvent combination noted in the present invention, followed by reaction and then phase inversion to yield the desired structures. Another route could involve a polyimide or a poly(arylene ether) containing terminal triethoxysilane groups. After spin casting on a substrate, the condensation of the triethoxysilane groups will yield a highly crosslinked network. Optionally, tetraethoxysilane can be added to yield an inorganic-organic hybrid system. The process noted in the present invention would be utilized to yield the desired nanoporous structure.

The average pore size of the nanoporous polymer films of the present invention for ILD applications is less than approximately 30 nanometers. The pore density or porosity is in the range of approximately 10 to 60 volume percent, preferably 30 to 60 volume percent. Typically, the solids content of the polymer solution prior to spin casting is in the range of approximately 4 to 12 weight percent, and after spin casting but before phase inversion 30 to 70 weight percent when the lowest boiling solvent is predominantly removed. The introduction of the non-solvent phase inversion fluid or liquid can be performed by immersion of the film and substrate in a bath of the non-solvent liquid or vapor atmosphere contact with the non-solvent fluid, but is more preferably performed by spin casting in the same general manner as the film forming spin casting. After phase inversion, the nanoporous film is dried to remove residual solvents and phase inversion fluids. The nanoporous films of the present invention result in isotropic pore structure, in contrast to some prior art anisotropic pore structure. The nanoporous films are transparent in appearance due to the fine isotropic pore structure. It is preferred that the highest boiling solvent and the phase inversion non-solvent fluid are miscible but otherwise possess differing properties. Film thicknesses of less than 10 microns are contemplated, but preferably, the film thickness is less than 2 microns, optimally 1 micron or less. The dielectric constant ($\epsilon$) of the films is preferably below 2.0, more preferably below 1.8.

Procedure and Results

The following experimental descriptions are intended as examples of the claims to be specified, and are not intended to limit the claims of this patent to the exact procedures and compositions defined below.

EXAMPLE 1

Solution Preparation (BTDA-DAM)

A sample of polyimide BTDA-DAM (benzophenone tetracarboxylic dianhydride-diamino mesitylene; number average molecular weight (Mn)~1–3×10$^4$ g/mol, poly dispersity index (PDI)=2–3 as determined by gel permeation chromatography (GPC) in N-methyl pyrroline (NMP) using polystyrene standards), was added to a known amount of propylene carbonate (PC, 99.7+%) to produce a 10 wt % solids solution. The mixture is heated to ~100° C. to produce a homogeneous amber solution. If left to cool the solution becomes slightly turbid and gels, and can not be spun onto a wafer to produce a homogeneous thin film. With stirring, a known amount of a 50/50 mixture of dioxane(D; 99+%)/tetrahydrofuran (THF; 99.99%) was added slowly to the hot solution to produce a clear, amber solution of ~5 wt % solids which did not gel upon cooling. All solutions were filtered through a 1.0 micron or smaller filter prior to spin casting.

The solution of BTDA-DAM in PC forms a gel at room temperature down to at least 2 wt % solids which was found to be thermoreversible; at lower solids contents (~2 wt %) the mixture also showed signs of being thixotropic. If only D is used to dilute the mixture to ~5 wt % the solution still gels upon cooling, however if only THF is used as a diluent the mixture does not gel. PC is a good solvent for BTDA-DAM, while D and THF are poor solvents. A good solvent is defined as one which can dissolve the polymer to at least 5 wt % (with heating and stirring), while a poor solvent is one which only partially dissolves a 5 wt % mixture.

EXAMPLE 2

Solution Preparation (PAE-2)

A sample of poly(aryl ether), PAE-2, (Mn~1×10$^4$ g/mol, PDI ~2–3) is dissolved in a mixture of cyclohexanone (C; 99.9%) and THF or D. The solutions used were ~5 wt % solids and ~40% by volume C. All solutions were filtered through a 1.0 micron or smaller filter prior to spin casting. All liquids are good solvents for this polymer as judged by rapid and complete dissolution of polymer at 5 wt % solids with stirring. PAE-2 has the following structure:

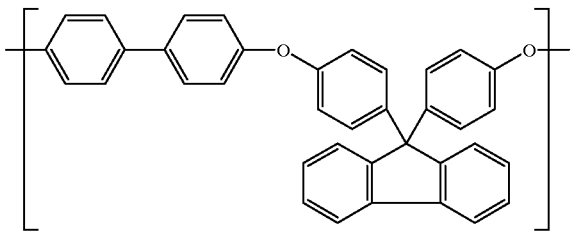

EXAMPLE 3

Spinning and Phase Separation/Inversion Procedure

Typically at a spinning rate of 500–2000 rpm on a 4" wafer, ~2 mL of solution is introduced over a few seconds. The sample typically remains spinning for 5–20 seconds after completely dispensing the solution, and may remain on the spinner chuck once spinning has stopped for an additional 0–120 seconds to allow the film to partially dry and equilibrate to the desired composition. The wafer is then removed and quickly immersed in a phase inversion solution (large excess relative to solvent) to structure the film and remove the solvents, locking the structured morphology in place.

Phase inversion may also be conducted on the spinner chuck by introduction of the phase inversion non-solvent fluid onto the sample while spinning. For this invention, the phase inversion solution may be any liquid or mixtures of liquids which causes a structuring of the polymer film through a phase inversion or separation process, as noted in the introduction. It was determined that the solution composition, as well as the phase inversion mixture and the spinning and phase inversion procedure are important to obtain the required thickness, porosity, pore size, and adhesion to the Si surface for the final polymer film.

For phase inversion of BTDA-DAM samples, wafers were left in the phase inversion bath typically for 30–90 seconds to fully remove residual solvents. For PAE-2 samples, immersion time was much shorter, requiring only 1–10 seconds in the phase inversion bath. Samples were then placed on a hotplate at 80° C. for 2 minutes and then 280° C. (200° C. only for PAE-2 films) to dry off any residual liquids.

For PAE-2 at 5 wt % solids content, the solvent composition was required to be at least 30–35 vol % C to prevent phase separation on the wafer during spinning, which would produce a textured film. Excessive texturing of the film was assessed visually and quantified by profilometry (a significant degree of dispersity in the thickness profile of the film across the wafer surface which continually changes over the length scale of several microns).

EXAMPLE 4

UV Curing Procedure

To lock the structured morphology in place, a UV curing stage was incorporated prior to the phase separation/inversion procedure. Wafer samples were placed inside a cylindrical clear glass chamber 1 cm deep×15 cm diameter with a quartz lid. The samples would then be exposed to a UV source (medium pressure Hg lamp from Ace Glass, 30 cm distance) for times ranging from 5–300 seconds. The lamp had an output of ~90 watts in the wavelength range of 365 nm to 220 nm. After exposure, the samples were typically immediately immersed in a phase inversion bath to structure the film.

The degree of crosslinking was assessed through high temperature bake. Samples of porous BTDA-DAM, dense BTDA-DAM, and porous BTDA-DAM which were irradiated with UV were first tested for $\epsilon$ to get initial values. The samples were then placed in an oven at 400° C. for 30 minutes (air). The $T_g$ of uncrosslinked BTDA-DAM is <375° C. so baking at 400° C. should collapse BTDA-DAM films which were structured without crosslinking, as indicated by $\epsilon$ values after baking.

Dielectric values for films were determined from thickness and capacitance values using a Tencor model P-2 profilometer and a Solartron model SI1260 frequency analyzer with a MSI Electronics model Hg-401 mercury probe with background corrections for capacitance of uncoated wafer and equipment. The total error in dielectric values is estimated to be <5%. Porosity values were determined from elipsometric measurements on a Sentech model SE800 elipsometer using the refractive indecies of dense polymer and air to model the experimental data. The results compared well with that calculated from dielectric values using the Clausius-Masotti equation. All wafers were tested initially for background corrections due to surface and bulk impurities.

Prior art in this area (Saunders et al) indicates that porous polymer films of tens to hundreds of microns thickness with pores in the micron size range can be easily and reproducible made from single solvent polymer solutions, in some cases with homogeneous pore size distribution. To be useful as an interlayer dielectric film for future generations of microelectronics, the smaller features dictate that film thicknesses and pore sizes will need to be 1–2 orders of magnitude smaller than that shown by Saunders, et al. Using a solution composed of a single, high boiling point solvent will not result in the desired final product.

Firstly, to obtain films with thicknesses of ~1 micron requires low viscosity solutions, implying low solids content (~5 wt %). Thinner films will also result in faster phase separation, which suppresses growth of nuclei, thus resulting in producing smaller pores. However as Saunders, et al. has shown, the composition of the film does not change significantly during the spinning process when using a single high boiling point solvent, thus the porosity of a thin film produced from a 5 wt % solids solution would approach 95%. High solvent compositions also favor slower phase separation kinetics and would effectively increase void sizes. Although a film with 95% porosity would have an extremely low $\epsilon$ the film would have little mechanical integrity. These concentrations would also favor nucleation and growth of polymer particles from solution, producing an interconnected porous structure which is not desirable.

To achieve both the desired porosity and pore structure (discontinuous voids in a polymer continuous phase produced from the nucleation of solvent(s) and non-solvent(s) from the polymer phase) while maintaining mechanical strength requires high solids content solutions, which are unable to form sufficiently thin films as Saunders has shown. In effect, there is no direct way in which a single, high boiling point solvent can produce both thin films and high solids content which would result in a nanoporous structure.

Conversely, using only a lower boiling point solvent will inevitably produce a dense film with a surface structured on the micron level as a result of phase separation during the spinning procedure.

The following examples indicate how polymer solutions composed of multiple solvents of significantly different boiling points ($\geq 50°$ C. can produce nanoporous, structured thin films on Si wafers with variable porosity, and thus variable $\epsilon$. Examples are also given for the use of UV irradiation to stabilize the porous structure to temperatures in excess of the polymer's original $T_g$, and of optimized phase inversion procedures to produce nanoporous films with good adhesion and electrical properties.

BTDA-DAM

For solutions of BTDA-DAM, it was determined important that the mixture be comprised of a solvent mixture of high boiling point and low boiling point solvents. Using a single high boiling point solvent solution of BTDA-DAM produces porous structures through phase inversion, however the pore sizes are generally at least an order of magnitude too large for the current application. For example, polyimides may be phase inverted from NMP only, producing pore sizes in the range of 1 micron and films which were visually opaque.

BTDA-DAM cannot be spun from solutions containing only propylene carbonate or ethylene carbonate (EC) as these mixtures gel upon cooling below ~50° C., making the production of a uniform thin film not possible. As well, EC crystallizes from solution when cooled. While spinning at high temperatures may circumvent these problems, this work also indicated that PC alone has little or no ability to impart a porous structure through phase inversion techniques. From studies of bulk gels of BTDA-DAM in PC it was determined that upon immersion of a portion of the gel in a non-solvent solution typically used for phase inversion of BTDA-DAM, the gel appears to proceed through what is better defined as a solvent exchange. The material retains its initial structure size and appearance, yet PC appears to be replaced by methanol. This, along with the gelling behavior of the mixtures of BTDA-DAM in PC, implies that a physically crosslinked structure is obtained. Upon drying this gel collapses to dense material.

The addition of both D and THF was found to be important to obtain thin films with small pore structures that otherwise could not be achieved. Neither THF nor D are good solvents for BTDA-DAM, as determined by solubility tests at ~5 wt % solids. An optimum range of solution compositions for producing small voids (<30 nm) with porosities from 10–50% was determined to be ~50 vol % PC and 10–40 vol % D and 10–40 vol % THF. In this range thin films could be produced with $\epsilon$ down to 1.7 having little or no visible opacity to the film. Samples from solutions containing 1:1:1-PC:D:THF yield $\epsilon$ as low as ~3 for similar spin conditions with pores <30 nm.

For samples spun from high D content solutions (>50 vol %) only dense films were produced. Samples spun from solutions with PC levels <~10 vol % phase separated on the wafer within 10 seconds of solution dispense, producing textured dense films. Thus the range of PC content required to allow for thin films to be spun and still produce a porous structure was determined to be from ~10 to ~75 vol %. Above 75 vol % PC thin films could only be spun if there were excess THF relative to D, and all produced opaque films indicating larger pores. Below ~10 vol % PC, the polymer was not fully dissolved in the solution and phase separation was observed soon after solution was dispensed. These results clearly indicate that a porous structure with pore sizes <30 nm can only be produced using a mixture of solvents. Note that one criteria for the use of PC, D, and THF is that they are all transparent to UV in the range required for excitation of the benzophenone moiety of BTDA-DAM, which has been determined to be the active species in crosslinking of this polyimide (Lin et al).

Other high boiling point liquid solvents were also tested; these included NMP, dimethyl sulfoxide (DMSO), pyridine, and C. Other low boiling point liquids considered included 3-methyl-1-butanol, glyme, acetonitrile, ethyl acetate, hexafluoroisopropanol, and diethyl ether. From SEM micrographs for polyimides BTDA-DAM (7 wt % solids) in 50/50:THF/NMP and 6FDA-DDA (20 wt % solids) in NMP only, it is clear that both composition (i.e., polymer and solvent type) and solids concentration have a strong effect on the final film character.

Films of BTDA-DAM in mixtures of PC+D+THF gel upon evaporation of THF from solution when spun onto wafers. Once gelled, diffusion rates within the film (and ultimately evaporation rates of low boiling point liquids from the film) drop substantially. As a result spinning times and drying times could be quite long for BTDA-DAM films (~3–5 minutes) prior to phase inversion and still produce films with significant porosity. Porous films produced from mixtures of PC/D/THF are optically clear and smooth (as determined by profilometry). Because of the clarity of the films it is expected that the majority of the pores are <30 nm in size, which is confirmed by SEM. Solution composition, phase inversion mixture, and spinning and phase inversion procedure govern the final film properties.

The composition of the phase inversion solution also has a big role in the final film character. Liquids tested extensively include water (distilled and deionized), methanol (MeOH; 99.99%), ethanol (EtOH; anhydrous) and mixtures thereof. These were chosen based on solubility of the solvent mixture in the phase inversion mixture, small molecular size (to enhance diffusion kinetics and thus phase inversion kinetics) and their lack of any solvency for the polymer. It was found that MeOH produced the films with the least opacity and lowest $\epsilon$. Films from EtOH were more opaque and less porous as a result of larger pore sizes, while those produced through phase inversion in water or water/MeOH resulted in films which were opaque, but had poor adhesion to the wafer, e.g., the film immediately cracked and peeled off the wafer when immersed in solution, and were often dense. Immersion time in the non-solvent solution was also determined to be important to obtain a porous structure with good adhesion; immersion times were optimized for the experiments performed.

TABLE 1

Dielectric and selective refractive index measurements for porous BTDA-DAM films:

| Sample # | dielectric cnst. ($\epsilon$) ± 5% | refractive index ($\eta$) ± 5% | % porosity ($\epsilon$; $\eta$) | pore size (nm) |
|---|---|---|---|---|
| 107-18C; 300-12; 300-13 (16633-7-3; 16633-41-2; 166333-41-3) | 4.14 | 1.6833 | 0 | na |
| 107-24C (16633-19-3) | 3.53 | — | 11 | <20 |
| 107-18D (16633-7-4) | 2.75 | 1.464 | 28,32 | <30 |
| 300-19A (16633-65-5) | 1.93 | — | 54 | <30 | dielectric - mercury probe + profilometry
refractive index - elipsometry
% porosity - volume percent calculated from Clasius-Mosotti relationship; model fit from elipsometry data
pore size - measured by SEM Solution compositions:
107-18C: Soln 16428-92-1; ~4 wt % BTDA-DAM (16428-12-1) in 50/25/25 PC/D/THF
300-12: Soln 16428-63-1; 5 wt % BTDA-DAM (16428-12-1) in C
300-13: Soln 16428-63-1; 5 wt % BTDA-DAM (16428-12-1) in C
107-24C: Soln 16428-92-1; ~4 wt % BTDA-DAM (16428-12-1) in 50/25/25 PC/D/THF
107-18D: Soln 16428-92-1; ~4 wt % BTDA-DAM (16428-12-1) in 50/25/25 PC/D/THF
300-19A: Soln 16633-64-1; ~5 wt % BTDA-DAM (16633-62-1) in 50/25/25: propylene carbonate/diphenyl ether/THF.
Polymer MW (GPC in NMP):
BTDA-DAM # 16428-12-1: Mn=1.76×10$^4$ g/mol, Mw=4.70×10$^4$ g/mol
BTDA-DAM # 16633-62-1: Mn=1.74×10$^4$ g/mol, Mw=3.62×10$^4$ g/mol Scanning electron microscopy imaging of the above materials showed that nanoporosity was achieved with uniformity and small pore structure. The dielectric values were reduced with increasing porosity (void content or pore density). The following decreasing dielectric values were achieved with increasing porosity:
SEM of dense BTDA-DAM @ e=4.14
SEM of porous BTDA-DAM @ e=3.53
SEM of porous BTDA-DAM @ e=2.75
SEM of porous BTDA-DAM @ e=1.93
Negative examples:
Scanning electron microscopy showed pores in the micron size range and a lack of uniform nanoporosity in the following cases:
SEM of polyimide 6FDA-DDA from NMP; 20 wt % solids (LR98112)
SEM of BTDA-DAM from 50/50 THF/NMP (LR94111)

EXAMPLE 5

Crosslinking via UV Irradiation

Locking the morphology in place via UV crosslinking allows the film to retain its structure during high temperature baking. Results shown below clearly indicate that baking porous BTDA-DAM samples for 10 minutes at 400° C. causes a significantly higher reduction in porosity for the non-irradiated samples versus the irradiated sample. The results for 30 minute bake at 400° C. clearly show that while the non-irradiated samples have high dielectric values (actually higher than dense unbaked material at 4.14) and a dense appearance via SEM, the irradiated samples have much lower values of F and still retain some porosity. The increase in F for the samples to values above the dense film is likely a reflection of oxidation or degradation of the film at this high temperatures. While E values for the irradiated samples did increase somewhat from their values prior to baking, the fact that they are still lower than the dense film indicates that porosity has been retained as a result of UV irradiation, presumably through a crosslinking mechanism.

TABLE 2

Elipsometry and dielectric data of irradiated and non-irradiated BTDA-DAM films - oven baking (400° C., air, 10 mins).

| Sample | porosity (pre-bake) vol. % | Irrdn time (sec) | porosity (post-bake) vol. % |
|---|---|---|---|
| 111-18D (16759-76-5) | 39 | 30 | 27 |
| 111-21A (16759-81-5) | 32* | 0 | 9 |
| 111-21B (16759-81-6) | 31* | 0 | 8 |

*estimated from dielectric data

Samples discolored after bake, turned slight golden color.

TABLE 3

Dielectric constant of irradiated and non-irradiated BTDA-DAM films - oven baking (400° C., air, 30 mins).

| Sample | ε (pre-bake) | Irrdn time (sec) | ε (post-bake) |
|---|---|---|---|
| 300-20A (16633-66-3) | 2.41 | 15 | 3.84 |
| 300-20B (16633-66-4) | 2.19 | 60 | 3.47 |
| 300-23B (16633-68-2) | 2.85 | 0 | 5.45 |
| 300-23D (16633-68-4) | 3.01 | 0 | 5.47 |
| 300-23E (16633-68-5) | 2.06 | 0 | 5.39 |

Samples discolored after bake, turned golden color but retained their respective levels of opaqueness. From SEMs done prior and post-bake it was determined that pore structure had been reduced:

20A: mostly dense, very little visible porosity, few very small pores.

20B: appears slightly porous; pores 20 nm–40 nm in size.

20C: mostly dense.

23B: film mostly dense

PAE-2

For PAE-2 it was also determined that the use of multiple solvents as solution components was also required for the application of porous thin films with significant porosity (>10 vol %) and suitable pore size (<30 nm) via a spin coating procedure. As with BTDA-DAM, PAE-2 could be applied using only a single high boiling point solvent; however, this inevitably resulted in pores >50 nm. The use of THF, D or 1,3-dioxolane as a diluent allowed for thin films to be applied which had the desired pore sizes (e.g., <30 nm). In these cases, these lower boiling solvents are good solvents for the polymer, yet solutions employing these lower boiling point liquids alone resulted in phase separation on the wafer within a few seconds after complete dispensing of the aliquot of solution. It was determined that it was preferred to have at least ~30–40 vol % C in the solution to prevent phase separation on the wafer and to produce the required porosity and pore sizes. As an example, a solution of 75 vol % C with 25 vol % THF (5 wt % solids) produced a film with 70 vol % porosity; samples made from high C content solutions (>75 vol %) typically produced very low dielectric values compared to mixed solution systems with pore sizes which were significantly larger than >50 nm.

Samples produced are optically clear as determined visually. Because of the clarity of the films it is expected that the majority of the pores are <30 nm in size; this was confirmed by SEM. The amount of spinning time after complete dispensing of solution, and the amount of time the wafer is left on the spinner after spinning has ceased will dictate the amount of residual solvent and thus the final porosity. For PAE-2 solutions, the spin times and drying times were shortened considerably as a result of the higher volatility of the high boiling point solvent used here (C, bp=155° C.) versus BTDA-DAM samples (PC, bp=240° C.) and the fact that BTDA-DAM samples produce a gel on the wafer which impedes drying. As a result, spinning times and drying times could be longer for BTDA-DAM films without eliminating all porosity. The solutions used to produce PAE-2 films dry much more rapidly, with C+D films appearing to dry more quickly than C+THF films. As a result, there are important time windows for spinning, drying, and phase inverting PAE-2 films which have been determined for these solutions. This allowed for good reproducibility and homogeneity in the film. The differences in spinning and phase inversion procedures for the two polymer systems appears to be caused by the differences in volatilities of the solutions and the gelating behavior of BTDA-DAM films on the surface of the wafer. Additionally solution components with very high boiling points, such as diphenyl ether, have been used to increase the time-window for phase inversion of PAE-2 solutions, while still producing clear films with low dielectric values.

Other poly(aryl ethers), (such as PAE-2 crosslinked with benzophenone functional groups, such as:

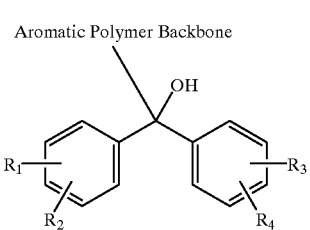

I

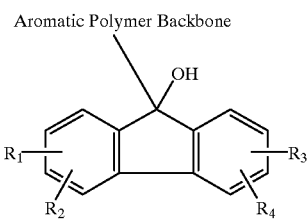

II and mixtures thereof, where $R_1$, $R_2$, $R_3$ and $R_4$ are individually H or alkoxy radical, the alkoxy can have a carbon chain of $C_{1-8}$, normal or branched) were also used for assessing the procedure to produce nanoporous films. At similar compositions to PAE-2 based mixtures, solutions of PAE-2 crosslinked with benzophenone functional groups in cyclohexanone and D or THF were phase inverted in a similar manner to produce clear films with dielectric values ranging down to ~1.9 with thicknesses of ~1 micron.

Porous PAE-2 films of ~0.5 micron thickness and 35% porosity ($\epsilon$=1.95) were tested for dielectric strength; there was no breakdown of the dielectric observed up to 0.8 MV/cm (sample 111–17, 16759–88). These films also showed excellent adhesion to Si substrates as determined by ASTM standard test method for measuring adhesion by tape test (ASTM-D3359).

The composition of the phase inversion solution also has a big role in the final film character. Fluids tested extensively include water (distilled and deionized), methanol (MeOH; 99.99%), ethanol (EtOH; anhydrous) and mixtures thereof. These were chosen based on solubility of the solvent mixture in the phase inversion mixture, small molecular size (to enhance diffusion kinetics and thus phase inversion kinetics) and their lack of any solvency for the polymer. Again it was found that MeOH produced films with the least opacity and lowest $\epsilon$. Films from EtOH were more opaque as a result of larger pore sizes, while those produced through phase inversion in water resulted in dense films. Water: MeOH mixtures (50/50) resulted in clear porous films with poor adhesion to the wafer.

Table 4 below shows a comparison of the physical properties of a non-porous PAE-2 film with results for porous films with the proper structure developed from multiple liquid solutions and for high C content solutions (>75 vol %).

TABLE 4

| Sample # | dielectric const.($\epsilon$) ±5% | refractive index($\eta$) ±5% | % porosity ($\epsilon$; $\eta$) | Ave. pore size (nm) |
|---|---|---|---|---|
| 16259-21-2 | 2.75 | 1.6808 | 0 | — |
| RC1 C710 257-17 (16759-85-1) | — | 1.530 | –; 21 | (<30) |
| 111-17 (16759-74-4) | 1.95 | 1.4325 | 34; 34 | (<30) |
| 111-15 (16759-74-5) | 1.98 | — | 33 | (<30) |
| 110-18C (16759-37-2) | 1.67 | — | 50 | <30 |
| 112-23A (16853-22-1 | 1.93 | — | 35 | (<30) |
| 112-23E 16853-22-5 | 1.91 | — | 37 | (<30) |
| 111-18A (16759-76-2) | 1.81 | — | 42 | >100 |
| 111-18B (16759-76-3) | 1.38 | — | 70 | >100 |
| 112-22A (16665-32) | 2.35 | — | 16 | <20 |
| 112-22O 16665-32) | 1.92 | — | 36 | <30 | dielectric - mercury probe + profilometry
refractive index - elipsometry
% porosity - volume percent calculated from Clasius-Mosotti relationship; model fit from elipsometry data.
pore size - measured by SEM; results in brackets indicates SEM not performed, samples visually clear.

Solution compositions:
16259-21-2: dense PAE-2 on SI wafer from Schumacher
16759-74-4: Soln 16759-62-1; ~5 wt % PAE-2 (16759-13) in ~40vol % C/60 vol % D
16759-74-5: Soln 16759-61-4; ~6 wt % PAE-2 (16759-38-2) in ~40vol % C/60 vol % THF
16759-37-2: Soln 16759-1-1; ~4.5 wt % PAE-2 (16759-13) in ~35 vol % C/65 vol % THF
16759-76-2, 3: Soln 16759-70-2; ~5 wt % PAE-2 (16759-13) in 75 vol % C/25 vol % THF
16853-22-1: Soln 16853-21-1; ~6 wt % PAE-2 (16853-9-1) in 40 vol % C/60 vol % 1,3-dioxolane
16853-22-5: Soln 16853-21-2; ~6 wt % PAE-2 (16853-9-1) in 6 vol % diphenyl ether, 34 vol % C, 60 vol %, 1,3-dioxolane
16665-32 (112-22A): Soln 16853-14-2; ~6 wt % PAE-2 with benzophenone class crosslink (16853-9-2) in 40 vol % C/60 vol % THF
16665-32 (112-22D): Soln 16853-14-3; ~6 wt % PAE-2 with benzophenone class crosslink (16853-9-2) in 40 vol % C/60 vol % D Polymer MW:
16759-13: formerly 16668-55-1, Mn=9.8×10$^3$ g/mol, d=2.7
16759-38-2: formerly 16496-11-1, Mn=9.6×10$^3$ g/mol, d=2.8

Scanning electron microscopy imaging of the above materials showed that nanoporosity was achieved with uniformity and small pore structure. The dielectric values were reduced with increasing porosity (void content or pore density). The following decreasing dielectric values were achieved with increasing porosity:
SEM of dense PAE-2 @e=2.75
SEMs of porous PAE-2 @e=1.67
SEM of porous PAE-2 @e=1.81

The present invention overcomes the drawbacks of film thickness, dielectric constant, porosity, stability and adhesion of the prior art, wherein the present invention provides low dielectric constant nanoporous thin films with good adhesion for use in dielectric layers for integrated circuits and various microelectronic devices. The unique process conditions of the present invention allow the achievement of these high performance films, which will allow polymeric interlayer dielectrics to be achieved in the reduced line dimensions contemplated by the electronic fabrication industry. The present process and the resulting low dielectric films are critical to the movement to decreased line dimension. Thus the present invention solves a significant need in the microelectronics fabrication industry as it moves to the next generation devices.

The present invention has been set forth with regard to several preferred embodiments, however, the present invention should not be limited to those embodiments, but rather the full scope of the present invention should be ascertained from the claims below.

What is claimed is:

1. A process for producing a nanoporous polymer film of no greater than 10 micron thickness having low dielectric constant value, comprising the steps of:
   (a) providing a polymer in a solution with at least two solvents for said polymer in which a lowest boiling solvent and a highest boiling solvent have a difference in their respective boiling points of approximately 50° C. or greater;
   (b) forming a film of said polymer in solution with at least said two solvents on a substrate;
   (c) removing a predominant amount of said lowest boiling solvent;
   (d) contacting said film with a fluid which is a non-solvent for said polymer, but which is miscible with said at least two solvents to induce phase inversion in said film;
   (e) forming an average pore size in said film in the range of less than 30 nanometers.

2. The process of claim 1 wherein said nanoporous film has a thickness of no greater than 2 microns.

3. The process of claim 1 wherein said substrate is a semiconductor.

4. The process of claim 1 wherein said lowest boiling solvent has a boiling point of approximately 100° C. or less and said highest boiling solvent has a boiling point of approximately 150° C. or more.

5. The process of claim 1 wherein said polymer is selected from the group consisting of poly(arylene ethers), polyimides, poly(phenyl quinoxalines), substituted poly(p-phenylenes), poly(benzobisoxazoles), polybenzimidazoles, polytriazoles and mixtures thereof.

6. The process of claim 1 wherein said lowest boiling solvent is selected from the group consisting of tetrahydrofuran, acetone, 1,4-dioxane, 1,3-dioxolane, ethyl acetate, methyl ethyl ketone, cyclohexanone, cyclopentanone and mixtures thereof.

7. The process of claim 1 wherein said highest boiling solvent is selected from the group consisting of dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, sulfolane, phenol, m-cresol, dimethyl sulfoxide, diphenyl ether, terphenyl, cyclohexanone, cyclopentanone and mixtures thereof.

8. The process of claim 1 wherein said fluid which is a non-solvent for said polymer is selected from the group consisting of water, methanol, ethanol, isopropanol, toluene, hexane, heptane, xylene, cyclohexane, butanol, cyclopentane, octane and miscible mixtures of these non-solvents.

9. The process of claim 1 wherein said polymer is crosslinked before contacting said film with said fluid which is a non-solvent.

10. The process of claim 1 wherein said polymer is crosslinked after contacting said film with said fluid which is a non-solvent.

11. The process of claim 1 wherein said polymer is crosslinked by photochemical crosslinking.

12. The process of claim 1 wherein said polymer is crosslinked by chemical crosslinking.

13. The process of claim 1 wherein said film is formed by spin casting.

14. The process of claim 1 wherein said contacting said film with said fluid which is a non-solvent is by spin casting.

15. The process of claim 1 wherein said contacting said film with said fluid which is a non-solvent is by immersion.

16. The process of claim 1 wherein said contacting said film with said fluid which is a non-solvent is by vapor atmosphere.

* * * * *